United States Patent
Seely

[11] Patent Number: 5,963,858
[45] Date of Patent: Oct. 5, 1999

[54] METHOD AND APPARATUS FOR MIXING SIGNALS

[75] Inventor: Warren Leroy Seely, Chandler, Ariz.

[73] Assignee: Motorola, Inc., Schaumburg, Ill.

[21] Appl. No.: 09/114,330

[22] Filed: Jul. 13, 1998

Related U.S. Application Data

[63] Continuation-in-part of application No. 08/639,602, Apr. 29, 1996, abandoned.

[51] Int. Cl.$^6$ ........................................................ H04B 1/26
[52] U.S. Cl. ........................... 455/326; 455/327; 455/333; 333/103
[58] Field of Search ................................... 455/118, 325, 455/302, 326, 327, 330, 333; 333/103, 104, 117

[56] References Cited

U.S. PATENT DOCUMENTS

| | | | |
|---|---|---|---|
| 4,509,208 | 4/1985 | Sogo et al. | 455/330 |
| 4,677,691 | 6/1987 | Scott | 455/326 |
| 5,006,811 | 4/1991 | Kruger | 455/333 |
| 5,214,796 | 5/1993 | Gorrie et al. | 455/326 |
| 5,265,269 | 11/1993 | Staudinger et al. | 455/330 |
| 5,303,418 | 4/1994 | Staudinger et al. | 455/326 |
| 5,551,074 | 8/1996 | Vice | 455/326 |

*Primary Examiner*—William A. Cuchlinski, Jr.
*Assistant Examiner*—Gertrude Arthur
*Attorney, Agent, or Firm*—John R. MacIntyre

[57] ABSTRACT

An apparatus includes a first mixer port (12), a second mixer port (14), a third mixer port (16), a first hybrid device (20) responsive to the first mixer port (12) and having a first and a second input/output port, a second hybrid device (40) responsive to the second mixer port (14), the third mixer port (16) responsive to the second hybrid device (40), and a switching device (30). The switching device (30) includes a first port (31) responsive to the first input/output port of the first hybrid device (20), a second port (32) responsive to the second port of the first hybrid device (20), a third port (34) in communication with the second hybrid device (40), a fourth port (36) in communication with the second hybrid device (40), and a switching element responsive to the first, second, third, and fourth ports (31, 32, 36, 34). The switching element includes a first field effect transistor (60) and a second field effect transistor (62). The first field effect transistor (60) is responsive to the first port (31) and is coupled to the third port (34), and the second field effect transistor (62) is responsive to the second port (32) and is coupled to the fourth port (36).

17 Claims, 2 Drawing Sheets

5,963,858

METHOD AND APPARATUS FOR MIXING SIGNALS

This is a continuation-in-part of application Ser. No. 08/639,602 filed on Apr. 29, 1996, now abandoned.

FIELD OF THE INVENTION

The present invention relates generally to mixing signals, and more particularly to an improved method and apparatus for mixing signals.

BACKGROUND OF THE INVENTION

Apparatus for mixing signals are known in the electrical art. One use of such a mixing apparatus, referred to as a mixer, is to combine a modulated or modulating signal with a local oscillator signal to produce a further modulated signal at another frequency so that the further modulated signal may be broadcast or detected. In a typical wireless communication receiver application, a modulated radio frequency (RF) signal is combined in a mixer with a local oscillator (LO) signal to produce an intermediate frequency (IF) signal which may be then further amplified and detected to recover information that was modulated onto the RF signal. In a transmitter, the process is reversed so that the LO signal is mixed with the IF signal to produce an RF signal that is amplified and transmitted.

Although conventional mixers may be used to mix such signals, the mixing process performed by such conventional mixers has nonlinearities that typically produce undesirable spurious signals, such as unwanted third order intermodulation products of the input signals. It would therefore be desirable to provide an improved mixer with improved linearity that could reduce such spurious signals. In addition, it would be desirable if the improved mixer could be implemented using integrated circuits to provide an economical device. Accordingly, there exists a need for an improved mixer that reduces spurious signals and may be economically produced using integrated circuit technology.

SUMMARY OF THE INVENTION

In order to address this need, the present invention provides an apparatus and method for mixing signals. According to a first aspect of the present invention, the apparatus includes a first mixer port, a second mixer port, a third mixer port, a first hybrid device responsive to the first mixer port and having a first and a second input/output port, a second hybrid device responsive to the second mixer port, and a switching device. The third mixer port is responsive to the second hybrid device. The switching device includes a first port responsive to the first input/output port of the first hybrid device, a second port responsive to the second port of the first hybrid device, a third port in communication with the second hybrid device, a fourth port in communication with the second hybrid device, and a switching element responsive to the first, second, third, and fourth ports. The switching element includes a first field effect transistor and a second field effect transistor. The first field effect transistor is responsive to the first port and is coupled to the third port, and the second field effect transistor is responsive to the second port and is coupled to the fourth port.

According to a further aspect of the present invention, the apparatus is a signal mixing apparatus. The signal mixing apparatus includes a first mixer port, a second mixer port, a third mixer port, a first mixing device, and a second mixing device. The first mixing device includes a first hybrid device, a second hybrid device, and a switching device. The first hybrid device is responsive to the first mixer port and has a first and a second input/output port. The second hybrid device is responsive to the second mixer port, and the third mixer port is responsive to the second hybrid device. The switching device includes a first port responsive to the first input/output port of the first hybrid device, a second port responsive to the second input/output port of the first hybrid device, a third port in communication with the second hybrid device, a fourth port in communication with the second hybrid device, and a switching element responsive to the first, second, third, and fourth ports.

The second mixing device includes a first hybrid device, a second hybrid device, and a switching device. The first hybrid device is responsive to the first mixer port and has a first and a second input/output port. The second hybrid device is responsive to the second mixer port, and the third mixer port is responsive to the second hybrid device. The switching device includes a first port responsive to the first input/output port of the first hybrid device, a second port responsive to the second input/output port of the first hybrid device, a third port in communication with the second hybrid device, a fourth port in communication with the second hybrid device, and a switching element responsive to the first, second, third, and fourth ports.

According to a further aspect of the present invention, a method of mixing signals is provided. The method includes the steps of: dividing a local oscillator signal received at a first port of a switching device into a first and a second local oscillator signal, the first local oscillator signal out of phase with respect to the second local oscillator signal; applying the first local oscillator signal across a first resistor to produce a first voltage; applying the second local oscillator signal across a second resistor to produce a second voltage, the first and second voltages comprising balanced voltages; applying a radio frequency signal to a second port of the switching device, the radio frequency signal having an amplitude less than an amplitude of the local oscillator signal; dividing the radio frequency signal into a first and a second radio frequency signal; producing a third voltage based on the first radio frequency signal; producing a fourth voltage based on the second radio frequency signal; generating a first and a second intermediate frequency signal based on the first, second, third, and fourth voltages via switching action within the switching device, the first intermediate frequency signal having substantially the same phase and amplitude as the second intermediate frequency signal; and adding the first intermediate frequency signal to the second intermediate frequency signal to produce a resulting intermediate frequency signal.

The invention itself, together with its attendant advantages, will best be understood by reference to the following detailed description, taken in conjunction with the accompanying drawings.

DETAILED DESCRIPTION OF THE PREFERRED EMBODIMENTS(S)

Figure 1:
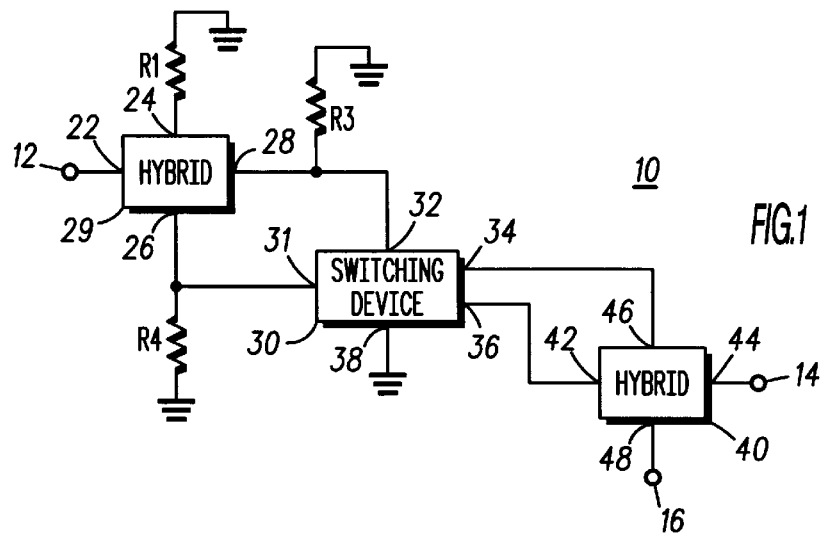
FIG. 1 is a circuit diagram of a particular embodiment of an apparatus for mixing signals.

Referring to FIG. 1, an apparatus 10 for mixing signals is disclosed. The apparatus 10 has a first mixer port 12, a second mixer port 14, and a third mixer port 16. The apparatus 10 includes a first hybrid device 20, a second hybrid device 40, and a switching device 30. The first hybrid device 20 has a first input/output port 22, a second input/output port 24, a third input/output port 26, and a fourth input/output port 28. Similarly, the second hybrid device 40 has a first input/output port 42, a second input/output port 46, a third input/output port 48, and a fourth input/output port 44. The switching device 30 has a first port 31, a second port 32, a third port 34, a fourth port 36, and a fifth port 38. The apparatus 10 further includes resistors R1, R3, and R4. Exemplary values for the resistors are R1=50 ohms, and R3=R4=120 ohms.

The first input/output port 22 of the first hybrid device 20 is coupled to the first mixer port 12. The second input/output port 24 is coupled to a first terminal of resistor R1. The third input/output port 26 is coupled to the first port 31 of the switching device 30 and to a first terminal of resistor R4, and the fourth input/output port 28 is coupled to the second port of the switching device 30 and to a first terminal of resistor R3. A second terminal of resistors R3 and R4 are grounded. The third port 34 of the switching device 30 is coupled to the second hybrid device 40 via the second input/output port 46. The fourth port 36 of the switching device 30 is coupled to the second hybrid device 40 via the first input/output port 42. The fifth port 38 of the switching device 30 is grounded.

The third input/output port 48 of the second hybrid device 40 is coupled to the third mixer port 16. The fourth input/output port 44 is coupled to the second mixer port 14.

The first and second hybrid devices 20, 40 are each preferably a four port 180 degree hybrid device, such as the hybrid disclosed in U.S. Pat. No. 4,992,761, which is incorporated by reference herein. The mixer ports 12, 14, and 16 are standard mixer ports. In a particular embodiment, the first mixer port 12 is a LO signal port, the second mixer port 14 is a RF signal port, and the third mixer port 16 is an IF signal port. In an exemplary downconverter application, the first mixer port 12 receives a local oscillator signal, the second mixer port 14 receives an RF signal, and the third mixer port 16 outputs a resulting IF signal.

During operation, an LO signal is applied to the LO signal port 12. The LO signal should have an amplitude (A) large enough such that the switching device 30 is substantially fully switched or saturated. The hybrid 20 divides the LO signal at the first input/output port 22 into two substantially equal amplitude signals of A/2 which are about 180 degrees out of phase with each other. The first of these signals is available at port 28 at a phase Ø. The second signal is available at port 26 at a phase of Ø+180 degrees. The LO signal is not available at port 24, and is thus isolated from the resistor R1. The LO signals thus generated are applied across the resistors R3 and R4, developing respective voltages that are 180 degrees out of phase with each other (A/2 at phase Ø and A/2 at phase Ø+180 degrees). Furthermore, the resistors R3 and R4 are preferably of equal value, and selected to provide impedance matching to the LO hybrid 20. The LO voltages thus developed are applied to the switching device 30, at ports 32 and 31. The applied voltages are said to be balanced, or equally above and below a reference ground tied to port 38.

An RF signal is applied to the RF signal port 14. The RF signal should have an amplitude (B) substantially smaller than the LO signal amplitude A to significantly reduce compression and the associated generation of distortion products. The hybrid 40 divides the RF signal at port 44 into two substantially equal amplitude signals of B/2 which are about 180 degrees out of phase with each other. The first of these signals is available at port 46 at a phase Ø. The second signal is available at port 42 at a phase of Ø+180 degrees. Since the RF signal is not available at 48, the RF signal is substantially isolated from the IF port 16. The RF signals thus generated are applied to the switching device 30 at ports 34 and 36 respectively, developing respective voltages that are about 180 degrees out of phase with each other (B/2 at phase Ø and B/2 at phase Ø+180 degrees). RF matching at RF port 44 is accomplished by proper selection of the switching device size. The RF voltages thus developed are applied to the switching device 30, at ports 34 and 36. The applied voltages are said to be balanced, or equally above and below a reference ground tied to port 38.

The switching device 30 accepts the balanced LO signals across ports 32 and 31. The switching device 30 is voltage controlled. Thus, the inputs 32 and 31 into the switching device 30 are high impedance inputs. The switching device 30 switches the RF input impedance into the switching device 30 at ports 34 and 36 between a high impedance and a low impedance at the rate of the LO frequency. Furthermore, the balanced LO signals serve to switch the switching device 30 such that when port 34 is a high impedance, port 36 is a low impedance, and when port 34 is a low impedance, port 36 is a high impedance. This switching action generates a resultant signal that is the frequency difference between the LO and RF signals, termed the IF signal. Two separate IF signals are generated. The first IF is generated in the switching device 30 and is available at port 34. It has a relative phase of ØLO+ØRF=ØIF. The second IF signal is generated in the switching device 30 and is available at port 36. It has a relative phase of ØLO+180+ØRF+180=ØLO+ØRF+360=ØLO+ØRF=Ø IF, preferably the same as the first IF at port 34. Thus, both IF signals generated in the switching device 30 are available at respective ports 34 and 36 have substantially the same phase and amplitude.

The IF signals available from the switching device 30 at ports 34 and 36 are applied to the hybrid 40, at ports 46 and 42 respectively. The hybrid 40 adds these IF signals and outputs the resultant IF signal at port 48, where it is made available to IF port 16. The two IF signals are not available at port 44, and are thus substantially isolated from the RF input 14.

Figure 2:
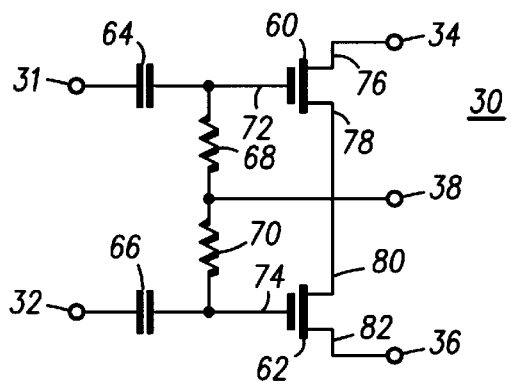
FIG. 2 is an expanded circuit schematic of the switching device of FIG. 1.

Referring to FIG. 2, the switching device 30 is illustrated. The switching device 30 includes a first field effect transistor 60 and a second field effect transistor 62. The first field effect transistor 60 has a first terminal 76 coupled to the third port 34 and has a second terminal 78 coupled to the fifth port 38. The second field effect transistor 62 has a first terminal 80 coupled to the fifth port 38 and has a second terminal 82 coupled to the fourth port 36. The switching device 30 further includes a first capacitor 64, a first resistor 68, a second capacitor 66, and a second resistor 70. The first capacitor 64 is coupled to the first port 31, and the second capacitor 66 is coupled to the second port 32. The first capacitor 64 and the first resistor 68 are each coupled to a gate input 72 of the first field effect transistor 60.

Similarly, the second capacitor 66 and the second resistor 70 are each coupled to a gate input 74 of the second field effect transistor 62. The first and second resistors 68, 70 are each coupled to the fifth port 38. In the particular example shown in FIG. 2, the first and second resistors 68, 70 are each 5000 ohm resistors, and the first and second capacitors 64, 66 are each 10 picofarad capacitors. The first and second field effect transistors 60, 62 are preferably Metal Semiconductor Field Effect Transistors (MESFETs). Preferably the apparatus 10 including the switching device 30 may be implemented in a Monolithic Microwave Integrated Circuit (MMIC).

The pair of balanced LO signals generated in hybrid 20 are applied to the switching device 30 across ports 31 and 32, relative to port 38 which is at ground potential. The first LO of amplitude A/2 at phase Ø is applied to the first switching device 30 at port 31. The second LO of amplitude A/2 at phase Ø+180 degrees is applied to the second switching device 30 at port 32. The capacitors 64 and 66 serve to pass the respective LO voltage signals to the respective MESFETs 60 and 62, at gates 72 and 74. The resistors 68 and 70 provide a means for draining excess charge off of the respective gates 72 and 74. The capacitors 64 and 66 also serve to block this charge from the LO hybrid 20 and thus combat unequal discharge paths which could result in unbalancing of the switching action.

The MESFETs 60 and 62 are switched by applying LO signals at the rate of the LO frequency. This switching action has the effect of alternately forming a high impedance and a low impedance in the MESFET 60 channel between the MESFET drain 76 and source 78, at the rate of the LO frequency. Similarly, the MESFET 62 is switched forming a high impedance and a low impedance in MESFET 62 between the MESFET drain 82 and source 80, at the rate of the LO frequency. The LO signals applied out of phase with each other at ports 31 and 32 act to switch the MESFETs 60 and 62 out of phase with each other. Thus the impedance at switching device 30 at port 34 is switching from a high impedance to a low impedance at the rate of the applied LO frequency. Similarly, the impedance at the switching device 30 at port 36 is switching from a high impedance to a low impedance at the rate of the applied LO frequency. The LO signals applied out of phase with each other at ports 31 and 32 cause the impedance at port 34 to be high when the impedance at port 36 is low, and the impedance at port 34 to be low when the impedance at port 36 is high.

The pair of balanced RF signals generated in hybrid 40 are applied to the switching device 30 across ports 34 and 36, relative to port 38 which is at ground potential. The first RF signal of amplitude B/2 at phase Ø is applied to the first switching device 30 at port 34. The second RF signal of amplitude B/2 at phase Ø+180 degrees is applied to the second switching device 30 at port 32.

The switching action generates a resultant signal that is the difference in frequency between the LO and RF signals, termed the IF signal. Two separate IF signals are generated. The first IF is generated in the MESFET 60 and is available at port 34. It has a relative phase of ØLO+ØRF=ØIF. The second IF is generated in MESFET 62 and is available at port 36. It has a relative phase of ØLO+180+ØRF+180= LO+ØRF+360=ØLO+ØRF=ØIF, substantially similar to the first IF at port 34. Thus both IF signals generated in the switching device 30 and available at ports 34 and 36 have substantially the same and preferably virtually identical phase and amplitude.

Figure 3:
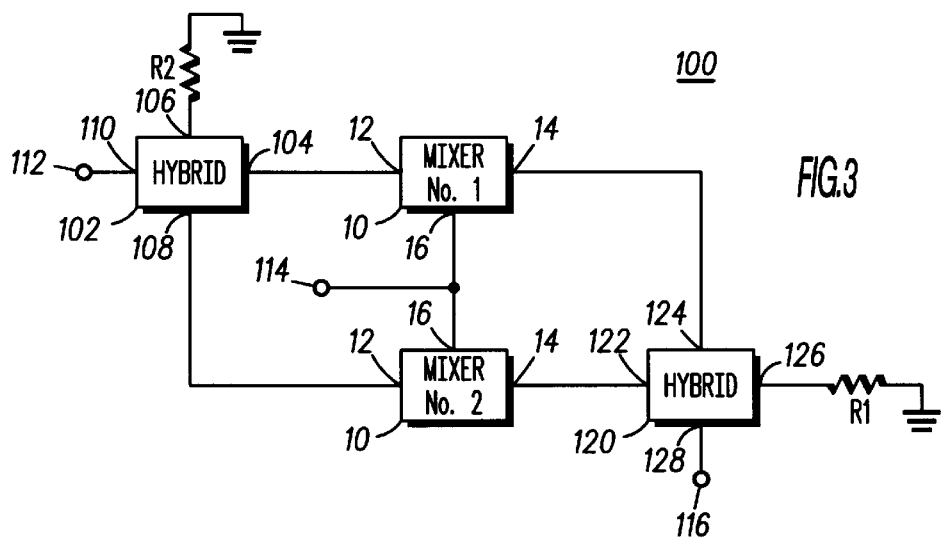
FIG. 3 is a circuit diagram of another embodiment of an apparatus for mixing signals.

Referring to FIG. 3, an embodiment of a double star mixer 100 is illustrated. The mixer 100 includes a first mixer 10, labeled mixer, a second mixer 10, labeled mixer 2, a first hybrid 102, and a second hybrid 120. The mixer 100 has a first mixer input/output port 112, a second mixer input/output port 114, and a third mixer input/output port 116. The first hybrid 102 has four input/output ports 104, 106, 108, 110. The first hybrid 102 is coupled to the first mixer 10 via input/output port 104 and is coupled to the second mixer 10 via input/output port 108. The first hybrid device 102 is coupled to the first mixer port 112 via input/output port 110. The first hybrid 102 is further coupled to a resistor R2, preferably having a resistance of about 50 ohms and connected to ground, via input/output port 106. Each of the first and second mixers 10 are coupled to the other mixer 10 and coupled to the second mixer port 114 via mixer ports 16. The second hybrid 120 also has four input/output ports 122, 124, 126, 128. The second hybrid 120 is coupled to the first mixer 10 via port 124, to the second mixer 10 via port 122, to the third mixer port 116 via port 128, and to a resistor R1 via port 126. Preferably, resistor R1 has a resistance of about 50 ohms and is grounded.

The first and second mixers 10 are preferably each configured as described for the mixer 10 of FIG. 1 and FIG. 2. However, it is contemplated that other suitable mixers may be used. The first and second hybrids 102, 120 are preferably 180 degree four port hybrids, such as the hybrid device described in U.S. Pat. No. 4,992,761, although any other suitable hybrid device known to those of ordinary skill may be used. Further, the values of resistors R1 and R2 may be changed as necessary for the specific mixer application that the apparatus 100 is to be used in.

During operation of the mixer 100, the LO signal is applied to the LO signal port 112. The LO signal should be large enough in amplitude such that the switching device 30 is fully switched or saturated. The hybrid 102 divides the LO signal with amplitude C at 110 into two substantially equal amplitude signals of C/2 which are approximately 180 degrees out of phase with each other. The first of these signals is available at port 104 at a phase Ø. The second signal is available at port 108 at a phase of Ø+180 degrees. The LO signal is not available at 106, and is thus substantially isolated from the resistor R2. The LO signals thus generated are applied to mixer1 and mixer2 at port 12. Thus each of these mixers are switched at the rate of the LO frequency, but 180 degrees out of phase with each other (C/2 at phase Ø and C/2 at phase Ø+180 degrees). The applied LO signals are balanced.

The RF signal is applied to the RF signal port 116. The RF signal should be substantially smaller in amplitude than the LO signal to substantially prevent compression and the associated generation of distortion products. The hybrid 120 divides the RF signal with amplitude D at port 128 into two equal amplitude signals of D/2 which are about 180 degrees out of phase with each other. The first of these signals is available at port 124 at a phase Ø. The second signal is available at port 122 at a phase of Ø+180 degrees. The RF Signal is substantially isolated from the resistor R1. The pair of balanced RF signals generated in hybrid 120 are applied to mixer1 and mixer2. The applied voltages are balanced (i.e. equally above and below a reference ground).

The mixer 100 operates such that mixer1 generates an IF signal at port 16 with a relative phase of ØLO+ØRF=ØIF. Mixer2 generates an IF signal at port 16 with a relative phase of ØLO+180+ØRF+180=ØLO+ØRF+360=ØLO+ØRF= ØIF, which is preferably virtually identical to the IF signal of mixer. Thus, both of these IF signals can be added directly at IF output 114.

Figure 4:
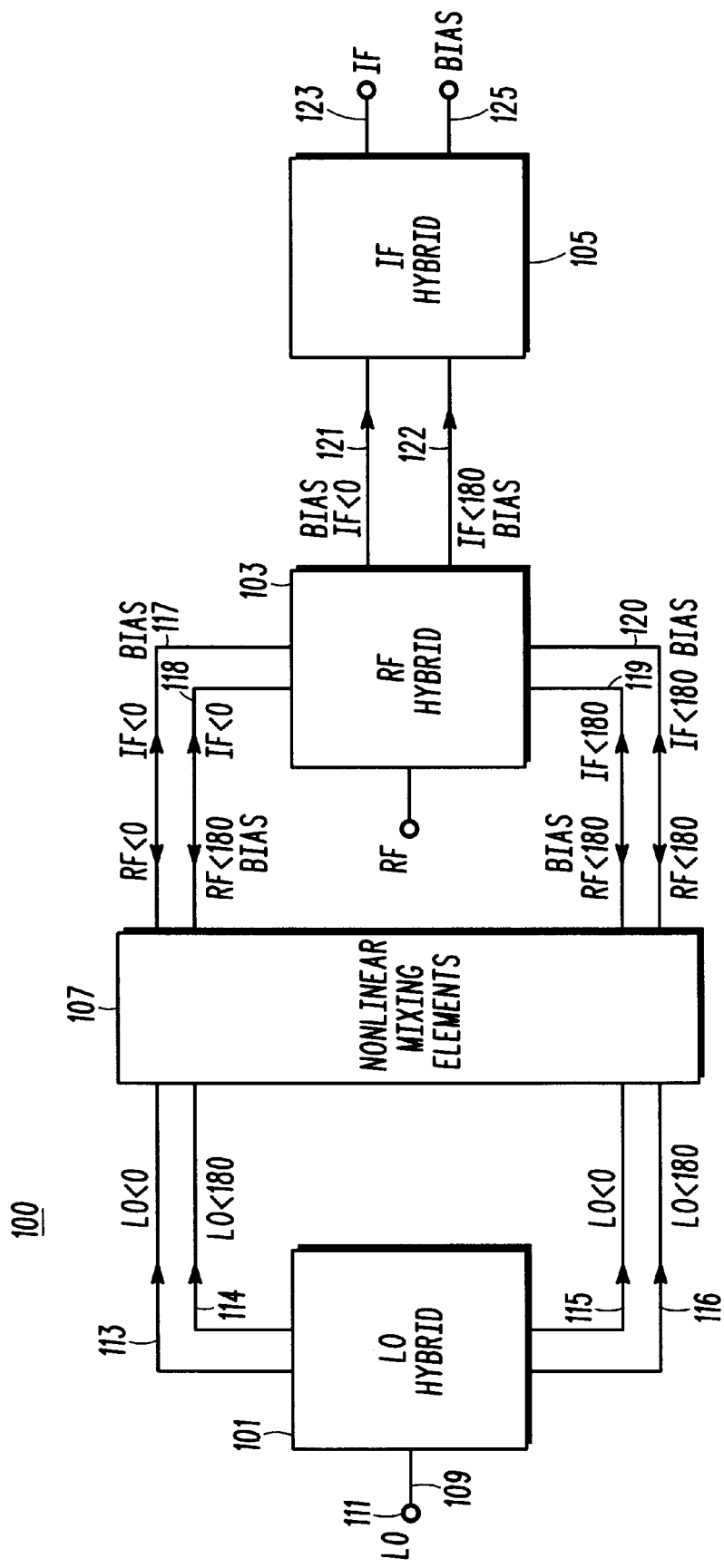
FIG. 4 is a simplified circuit diagram of an apparatus for mixing signals in accordance with a further alternate embodiment of the present invention.

A simplified block diagram of a double-balanced star MESFET mixer is shown in FIG. 4. Mixer 100 includes three sets of hybrids, an LO hybrid 101, an RF hybrid 103, and an IF hybrid 105. Mixer 100 also includes a set of nonlinear mixing elements 107 made up of GaAs MESFETs and additional passive elements. LO hybrid 101 may include 5 k ohm shunt resistors and 10 pf series capacitors, which effect the self detected DC levels within mixer 100, and thus effect the required LO power. Without these components, a lower LO power can be used (by approximately 5 dB) to operate mixer 100, with a corresponding decrease in the final 1 dB compression point and also the intercept points. Additionally, an optional port at IF hybrid 105 is available to inject a bias current into mixer 100, resulting in improved compression and intercept characteristics without increasing the LO power required. The increase is typically about 10 dB each. The optional gate circuitry and bias may be used together or separately, depending on the final performance desired.

An LO signal 109 is applied to the LO port 111 of mixer 100, and power is divided into four signals 113–116 that are substantially identical, other than the phase of the signal. The power in each of the resulting signals 113–116 is approximately ¼ the power of signal 109. The phase relationship of the divided LO signals 113–116 is such that two of the signals (114, 116) are 180 degrees out of phase with the remaining two signals (113, 115). The signals 113–116 are applied in pairs, as differential of balanced signals, to MESFET gates, thus causing the MESFETs to switch between on and off states at the LO frequency or rate. The differential application of the LO signals will cause the corresponding MESFET pairs to switch out of phase with each other. The amplitude of the LO signal must be sufficient to cause the MESFETs to switch fully on and fully off in order to realize efficient mixing. However, too large of an LO signal will overdrive the MESFET junctions, resulting in higher harmonics and distortion, poor switching, or even junction breakdown and/or damage to the MESFETs. Thus, there is an optimum LO power range which must be used to operate mixer 100.

The MESFET sources are preferably grounded, thus causing the RF signals to be applied drain to source, across the MESFET channels. The switching action of the MESFETs, created by LO 111, acts to switch the RF on and off, resulting in an RF signal that is 100% modulated at the LO rate. Analysis of this resulting chopped signal proves it to be rich in the difference or IF signal, and thus an efficient mixer.

Four separate IF signals 117–120 are generated, one in each MESFET channel. The relative phase relationships of IF signals 117–120 at the drain of each MESFET can be found by summing the relative phase relationships of the LO and RF signals applied to each MESFET. Thus, it can be seen that each MESFET pair generates two separate IF signals that are in phase with each other, but are out of phase with the IF signals generated in the other pair. Signals 117–120 are then combined by RF hybrid 103, resulting in a differential of balanced pair of IF signals 121–122, which are then combined by IF hybrid 105 into a single IF signal 123, to be utilized by the system in which mixer 100 is inserted.

LO signal 109 is always required, at a relatively high power level in order to cause MESFET switching. The RF or IF can be the system input, resulting in a corresponding IF or RF output. Conversion loss is the fundamental measure of conversion efficiency. The in-band conversion loss of mixer 100 typically ranges from 6 dB to 10 dB, depending on the technological implementation of the circuitry and related circuit loses. In this embodiment, the circuit was developed for GaAs MMIC integration. All circuitry except for the IF hybrid can be easily integrated onto an IC. The IF circuitry is preferably included as off-die discrete components.

An optional bias port 125 allows injection of identical currents into the channels of each MESFET. This current can be adjusted to minimize the harmonic/intermod content of mixer 100. An optimal current of about 10 mA per MESFET was found to result in about a 10 dB improvement in compression and intermodulation products.

The above described preferred embodiment provides many benefits. For example, IF baluns and/or hybrids are physically large and very difficult to realize monolithically. In the topologies described herein, the phasing of the IF signals reduces or substantially eliminates the need for IF baluns or IF Hybrids. Thus, an entire mixer, either mixer 10 or mixer 100, is able to be integrated on die without off-die components. In addition, the mixer topologies allow the injection of current directly into the IF port to provide transfer characteristic distortion in the MESFET switching devices, resulting in significantly improved mixer linearity.

It should be understood that for purposes of this application, one component is responsive to or in communication with another component regardless of whether the two components are directly coupled or indirectly coupled, such as via intermediate components, including switches that operatively couple the components for only a segment of time, as long as a signal path can be found that directly or indirectly establishes a relationship between the components. For example, the switching device 30 is responsive to the first mixer port 12, as defined herein, even though intermediate components, such as the first hybrid 20, are disposed between the switching device 30 and the first mixer port 12.

While certain aspects of the invention have been described in conjunction with specific embodiments thereof, it is evident that many alterations, modifications, and variations will be apparent to those skilled in the art in light of the foregoing description. For example, while mixer 10 of FIG. 1 has been described in terms of specific electronic circuitry relationships, one skilled in the art will appreciate that the mixer may be embodied in a variety of ways, such as appropriately configured hardwired circuit elements, or ASICs (application specific integrated circuits). Further, the invention is not limited in application to just mixers in wireless communication systems, but also applies to other mixers for other types of systems.

Further advantages and modifications of the above described apparatus and method will readily occur to those skilled in the art. The invention, in its broader aspects, is therefore not limited to the specific details, representative apparatus, and illustrative examples shown and described above. Various modifications and variations can be made to the above specification without departing from the scope or spirit of the present invention, and it is intended that the present invention cover all such modifications and variations provided they come within the scope of the following claims and their equivalents.

What is claimed is:

1. An apparatus for mixing radio frequency signals, the apparatus comprising:

a first mixer port;

a second mixer port;

a third mixer port;

a first hybrid device responsive to the first mixer port and having a first and a second input/output port;

a second hybrid device responsive to the second mixer port, the third mixer port responsive to the second hybrid device;

a switching device comprising:

a first port responsive to the first input/output port of the first hybrid device;

a second port responsive to the second input/output port of the first hybrid device;

a third port in communication with the second hybrid device;

a fourth port in communication with the second hybrid device; and a switching element responsive to the first, second, third, and fourth ports, the switching element comprising a first field effect transistor and a second field effect transistor, the first field effect transistor responsive to the first port and coupled to the third port and the second field effect transistor responsive to the second port and coupled to the fourth port; and a third hybrid device responsive to the first and second hybrid devices, the third hybrid device coupling the first hybrid device and the second hybrid device to the second mixer port.

2. The apparatus of claim 1, wherein the switching device further comprises a fifth port.

3. The apparatus of claim 2, wherein the first and second field effect transistors are each coupled to the fifth port.

4. The apparatus of claim 1, wherein the first field effect transistor has a gate input coupled to a first terminal of a first resistor and coupled to a first terminal of a first capacitor.

5. The apparatus of claim 4, wherein the second field effect transistor has a gate input coupled to a first terminal of a second resistor and coupled to a first terminal of a second capacitor.

6. The apparatus of claim 5, wherein the first resistor has a second terminal coupled to the fifth port and the second resistor has a second terminal coupled to the fifth port.

7. The apparatus of claim 6, wherein the first capacitor has a second terminal coupled to the first port and the second capacitor has a second terminal coupled to the second port.

8. The apparatus of claim 7, wherein the fifth port is grounded.

9. The apparatus of claim 1, wherein the first hybrid device comprises a four port 180 degree hybrid.

10. The apparatus of claim 1, wherein the first hybrid device comprises a four port signal splitting/combining device.

11. The apparatus of claim 1, further comprising a first resistor coupled to the first input/output port of the first hybrid device and a second resistor coupled to the second input/output port of the first hybrid device.

12. A signal mixing apparatus comprising:

a first mixer port;

a second mixer port;

a third mixer port;

a first mixing device comprising:

a first hybrid device responsive to the first mixer port and having a first and a second input/output port;

a second hybrid device responsive to the second mixer port, the mixer port responsive to the second hybrid device; and a switching device comprising:

a first port responsive to the first input/output port of the first hybrid device;

a second port responsive to the second input/output port of the first hybrid device;

a third port in communication with the second hybrid device;

a fourth port in communication with the second hybrid device; and a switching element responsive to the first, second, third, and fourth ports;

a second mixing device comprising:

a first hybrid device responsive to the first mixer port and having a first and a second input/output port;

a second hybrid device responsive to the second mixer port, the mixer port responsive to the second hybrid device; and a switching device comprising:

a first port responsive to the first input/output port of the first hybrid device;

a second port responsive to the second input/output port of the first hybrid device;

a third port in communication with the second hybrid device;

a fourth port in communication with the second hybrid device; and a switching element responsive to the first, second, third, and fourth ports; and a third hybrid device responsive to the first and second mixing devices, the third hybrid device coupling the second hybrid device of the first mixing device and the second hybrid device of the second mixing device to the second mixer port.

13. The apparatus of claim 12, further comprising a fourth hybrid device coupling the first hybrid device of the first mixing device, the first hybrid device of the second mixing device, and the first input port.

14. The apparatus of claim 12, wherein the third mixer port is directly coupled to the second hybrid device of the first mixing device and to the second hybrid device of the second mixing device.

15. The apparatus of claim 12, wherein the first hybrid device of the first mixing device comprises a four port signal splitting/combining network.

16. The apparatus of claim 15, wherein the first hybrid device provides a relative phase shift between the first and second outputs.

17. The apparatus of claim 16, wherein the relative phase shift is about 180 degrees.

* * * * *